(12) United States Patent
Leuten

(10) Patent No.: US 12,096,566 B2
(45) Date of Patent: Sep. 17, 2024

(54) RECIPROCAL PCB MANUFACTURING PROCESS

(71) Applicant: Intel Corporation, Santa Clara, CA (US)

(72) Inventor: Tyler Leuten, Orangevale, CA (US)

(73) Assignee: Intel Corporation, Santa Clara, CA (US)

( * ) Notice: Subject to any disclaimer, the term of this patent is extended or adjusted under 35 U.S.C. 154(b) by 1537 days.

(21) Appl. No.: 16/157,185

(22) Filed: Oct. 11, 2018

(65) Prior Publication Data

US 2020/0120808 A1 Apr. 16, 2020

(51) Int. Cl.
*H05K 3/00* (2006.01)
*H05K 1/11* (2006.01)
*H05K 1/18* (2006.01)

(52) U.S. Cl.
CPC ........... *H05K 3/0097* (2013.01); *H05K 1/117* (2013.01); *H05K 1/181* (2013.01); *H05K 3/0026* (2013.01); *H05K 2201/09045* (2013.01); *H05K 2201/09154* (2013.01); *H05K 2201/09972* (2013.01); *H05K 2201/10522* (2013.01); *H05K 2203/308* (2013.01)

(58) Field of Classification Search
CPC ........ H05K 3/00; H05K 3/0097; H05K 1/117; H05K 1/181; H05K 3/0026; H05K 2201/09045
USPC .......................................................... 361/760
See application file for complete search history.

(56) References Cited

U.S. PATENT DOCUMENTS

| | | | |
|---|---|---|---|
| 9,773,764 B2 * | 9/2017 | Melone | H01L 25/16 |
| 9,881,862 B1 * | 1/2018 | Otremba | H01L 23/49861 |
| 2007/0235855 A1 * | 10/2007 | Bokatius | H01L 23/552 257/691 |
| 2019/0052060 A1 * | 2/2019 | Gerhard | H01S 5/3018 |

* cited by examiner

*Primary Examiner* — Tremesha S Willis
(74) *Attorney, Agent, or Firm* — Schwabe, Williamson & Wyatt, P.C.

(57) ABSTRACT

Embodiments disclosed herein include a printed circuit board (PCB) with a non-uniform thickness and methods of fabricating such PCBs. In an embodiment, the PCB comprises a connector region with a top surface and a bottom surface, and a component region with a top surface and a bottom surface. In an embodiment, the bottom surface of the connector region is coplanar with the bottom surface of the component region. In an embodiment the top surface of the connector region is not coplanar with the top surface of the component region.

10 Claims, 7 Drawing Sheets

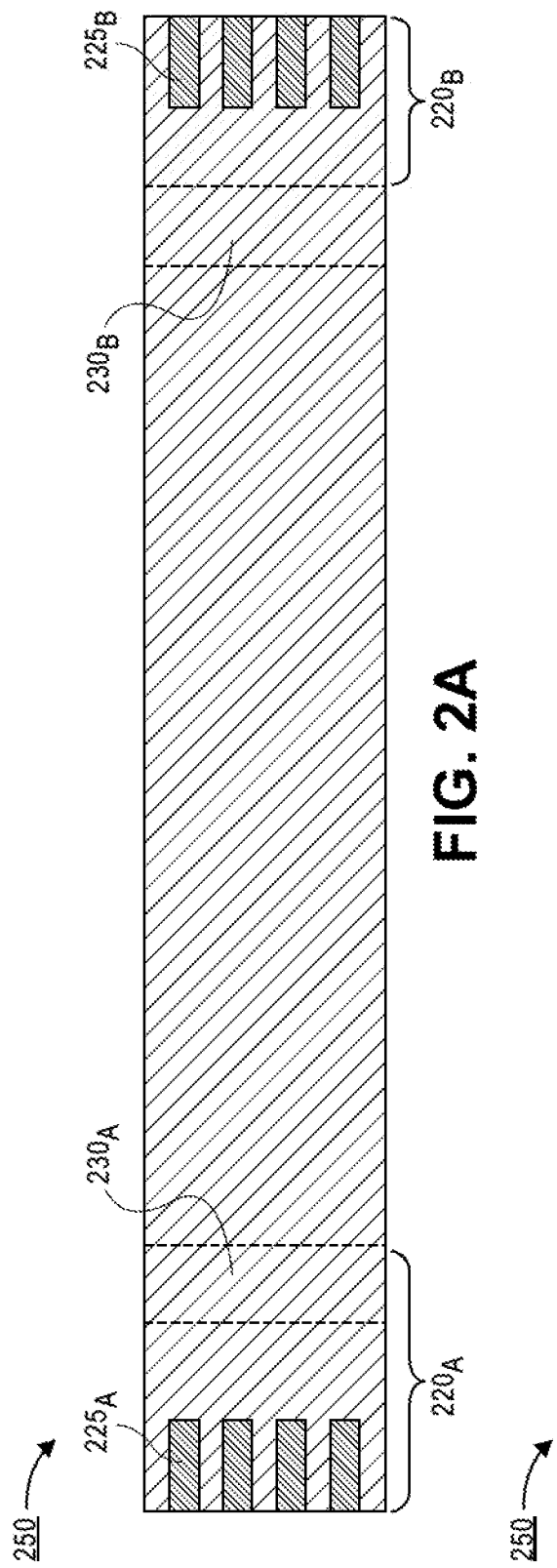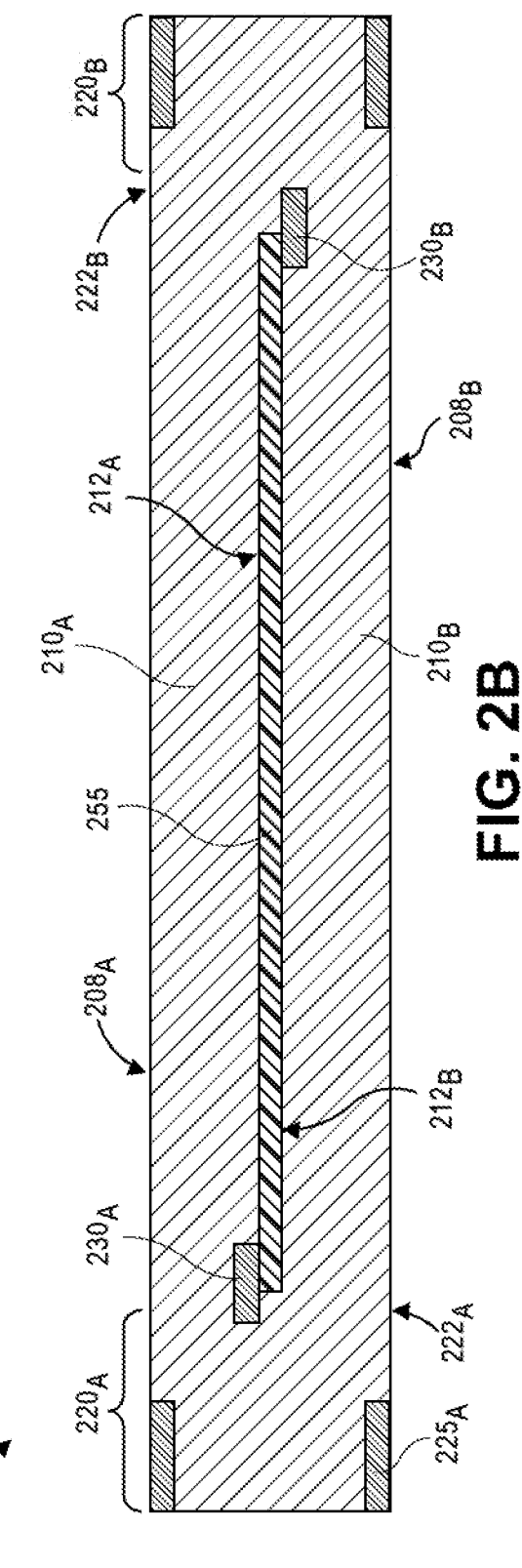

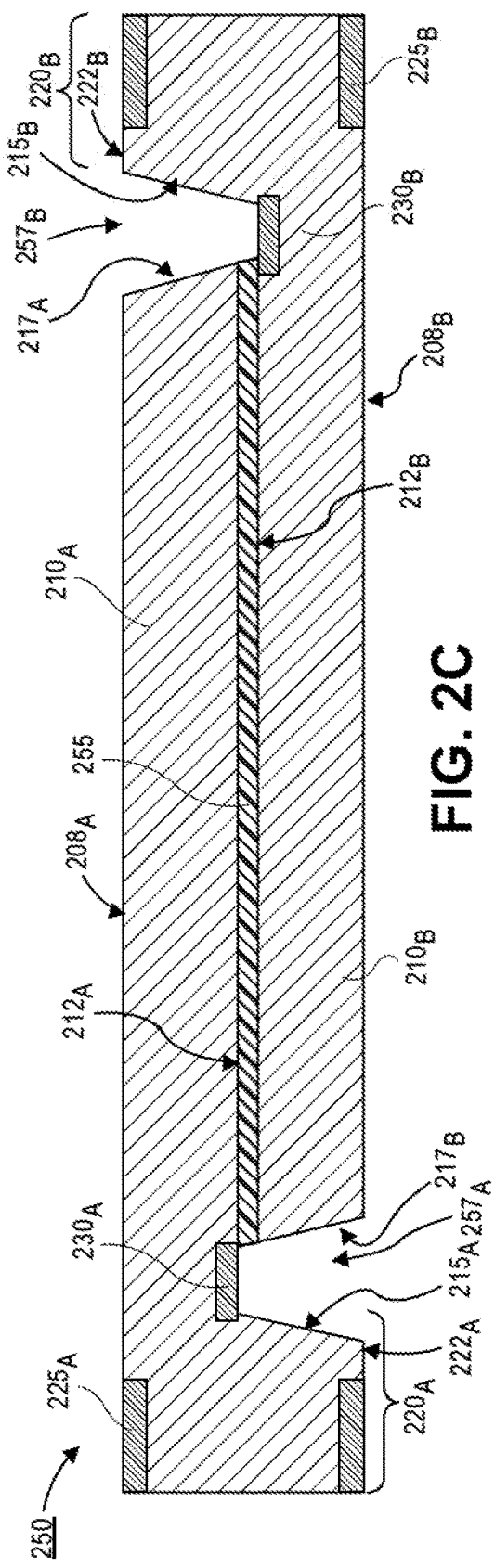
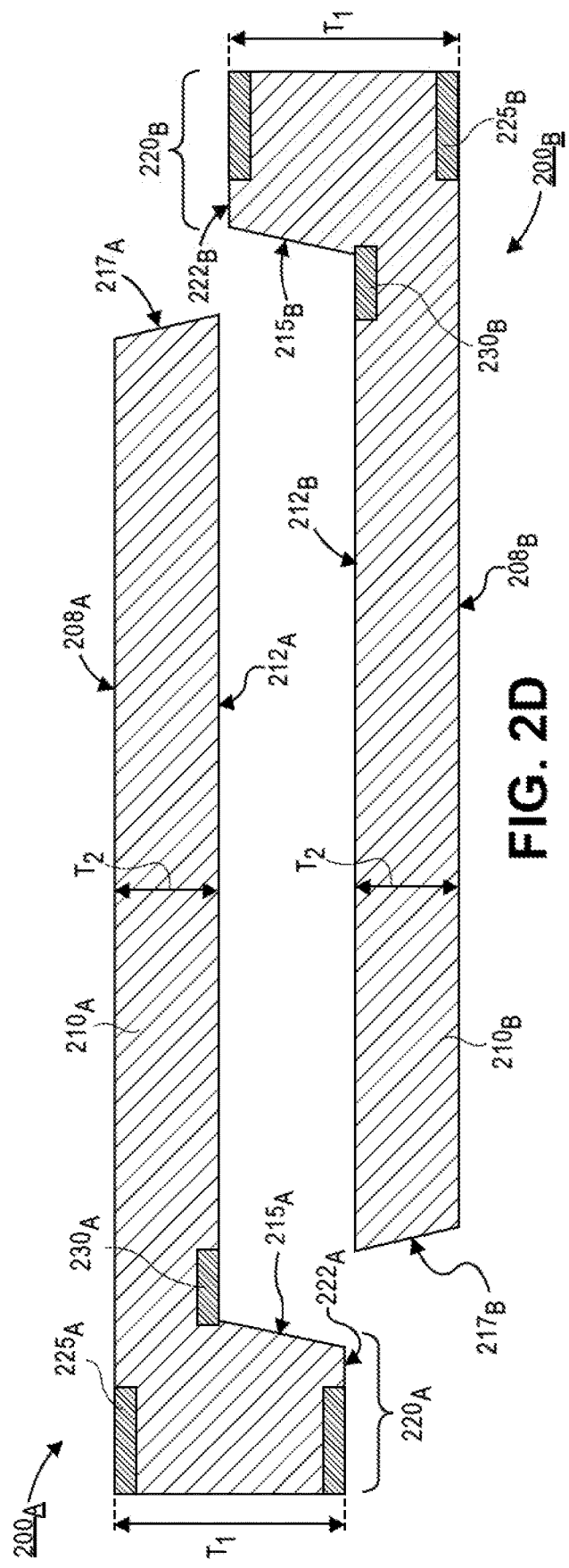

RECIPROCAL PCB MANUFACTURING PROCESS

TECHNICAL FIELD

Embodiments of the present disclosure relate to electronics packaging, and more particularly, to printed circuit boards (PCBs) with non-uniform thicknesses.

BACKGROUND

Printed circuit board (PCB) level hardware have physical specifications relating to: 1) the electrical connector; 2) whether the board is single or double sided; and 3) the total product thickness including components, heat shields, labels, etc. Achieving a single sided device with low product thickness is desirable in the marketplace. For the M.2 standard, products will generally conform to the following component thickness ratings: S1 is 1.2 mm; S2 is 1.35 mm; and S3 is 1.5 mm. To meet the desired thickness rating, design engineers must strike a balance between performance, density, component selection, and cost.

For a single sided board, the total product thickness of a PCB is measured from the PCB backside to the highest component mounted to the PCB. One contribution to the total thickness is the thickness of the PCB connector. For example, the connector thickness of an M.2 connector is 800 microns. Accordingly, the PCB board needs to be at least 800 microns thick in order to form the connector. Components mounted onto the board then add to the total thickness of the device. Accordingly, it becomes exceedingly difficult to design high performance devices.

BRIEF DESCRIPTION OF THE DRAWINGS

FIG. 2A is a plan view illustration of a PCB stack with embedded laser stops and a release layer, in accordance with an embodiment.

FIG. 2B is a cross-sectional illustration of the PCB stack in FIG. 2A, in accordance with an embodiment.

FIG. 2C is a cross-sectional illustration after openings are formed to expose the laser stops, in accordance with an embodiment.

FIG. 2D is a cross-sectional illustration after the release layer is removed and the PCB stack is separated to provide a first PCB and a second PCB, in accordance with an embodiment.

EMBODIMENTS OF THE PRESENT DISCLOSURE

Figure 1:
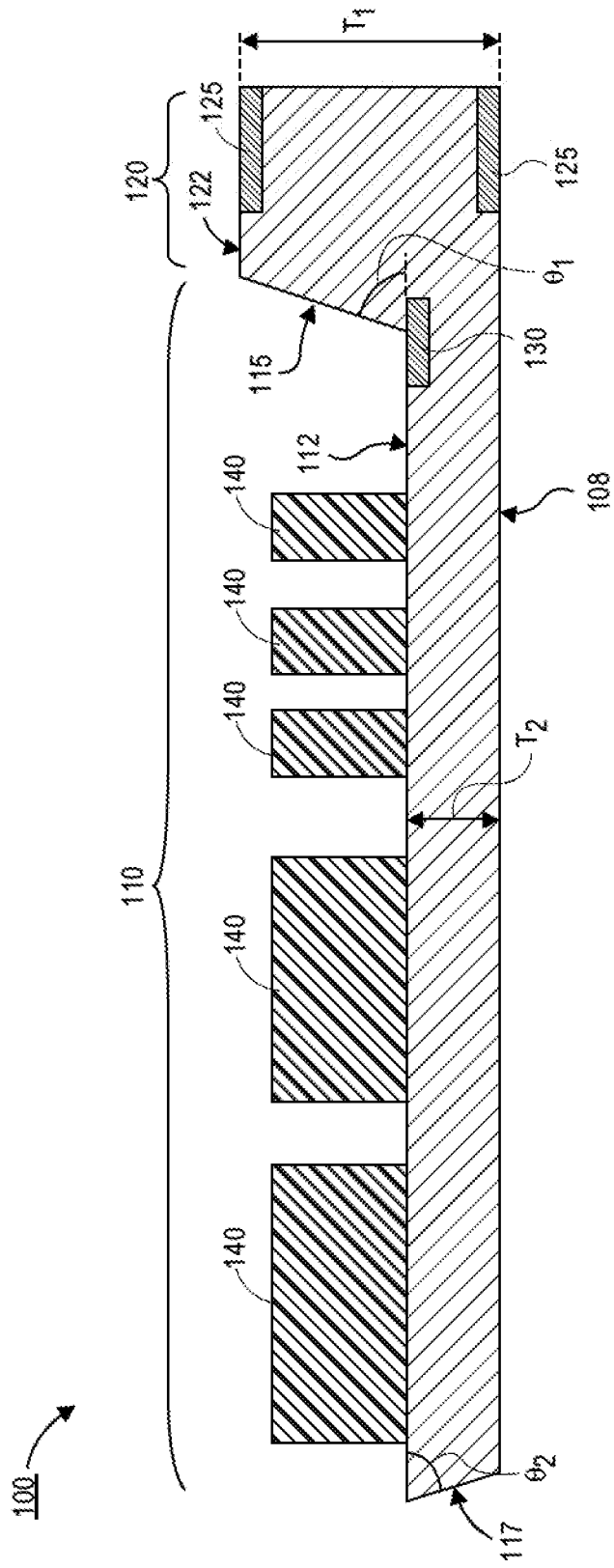
FIG. 1 is a cross-sectional illustration of a printed circuit board (PCB) with a non-uniform thickness, in accordance with an embodiment.

Described herein are electronics packages with printed circuit boards (PCBs) with non-uniform thicknesses and methods of forming such PCBs. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the connectors for the printed circuit board (PCB) contribute a large portion of the overall thickness of a device. Accordingly, the choice of components attached to the PCB is limited in order to conform to standard thicknesses. Accordingly, embodiments disclosed herein include a PCB with a non-uniform thickness. Particularly, embodiments include a PCB with a connector region and a component region. The connector region has a first thickness that is suitable for standard connection architectures (e.g., M.2), and the component region has a second thickness that is less than the first thickness. Accordingly, a portion of the thickness of the components is hidden by the thickness of the connector instead of being added to the thickness of the connector. As such, electronic packages formed on PCBs disclosed herein allow for greater design freedom and allow for higher performance devices without increasing the form-factor.

Furthermore, embodiments disclosed herein include methods of forming PCBs with non-uniform thicknesses with a process that minimizes waste. Particularly, embodiments include forming PCBs in reciprocal pairs. In such embodiments, a first connector and a second connector are formed at opposite ends of a single PCB stack. A release layer comprising a first laser stop, a second laser stop, and a release material are embedded in the PCB stack. The release layer separates a first component region from a second component region (i.e., the first component region is above the release layer and the second component region is below the release layer). After laser drilling from the top and bottom surfaces to the laser stops, the first connector (which is attached to the first component region) may be separated from the second connector (which is attached to the second component region).

Referring now to FIG. 1, a cross-sectional illustration of a PCB 100 is shown, in accordance with an embodiment. In an embodiment, the PCB 100 may comprise a component region 110 and a connector region 120. In an embodiment, the connector region 120 may have a first thickness $T_1$ and the component region 110 may have a second thickness $T_2$ that is less than the first thickness $T_1$. For example, the first thickness $T_1$ may be the standard thickness of a connector architecture. In a particular embodiment, the connector architecture may be an M.2 connector, though embodiments are not limited to such architectures. In an embodiment, the connector region 120 may comprise conductive pads 125 (pins, or the like) for interfacing with an external component (e.g., a motherboard). In an embodiment, where the connector region is an M.2 connector, the first thickness $T_1$ may be 800 microns. However, it is to be appreciated that the first thickness $T_1$ may be any desired thickness to accommodate different connector architectures.

In an embodiment, the component region 110 may have a thickness $T_2$ that is less than the thickness $T_1$ in order to accommodate components 140 without exceeding total PCB thickness limitations. In a particular embodiment, the second thickness $T_2$ may be approximately one-half the first thickness $T_1$. However, additional embodiments may include a second thickness $T_2$ that is less than the first thickness $T_1$, less than one-half the first thickness $T_1$, or the like.

In an embodiment, one or more components 140 (e.g., memories, processors, passive electrical components, etc.) may be electrically and mechanically coupled (e.g., with ball grid array (BGA) balls (not shown)) to the component region 110 of the PCB 100. Since the component region 110 has a thickness $T_2$ that is less than the first thickness $T_1$ of the connector region 120, at least a portion of the thickness of the components 140 is "hidden" by the thickness of the connector region 120. In the illustrated embodiment, the components 140 are all shown as having a thickness that is less than the difference between the first thickness $T_1$ and the second thickness $T_2$. That is, the entire thickness of the components 140 is hidden by the connector region 120. However, it is to be appreciated that in some embodiments, a portion of the components 140 may extend above the top surface 122 of the component region 120.

In an embodiment, the component region 110 and the connector region 120 may share a bottom surface 108. That is, the bottom surface of the component region 110 may be substantially coplanar with the bottom surface of the connector region 120. In such an embodiment, the difference in the thicknesses may be attributable to a top surface 112 of the component region 110 being non-coplanar with a top surface 122 of the connector region 120.

In an embodiment, the top surface 122 of the connector region 120 may be coupled to the top surface 112 of the component region 110 by a chamfered edge 115. In an embodiment, the chamfered edge 115 may have a chamfered profile that is characteristic of laser drilling processes common in the art of PCB manufacturing. In an embodiment, a laser stop 130 may be located at the interface between the chamfered edge 115 and the top surface 112 of the component region 110. For example, the laser stop 130 may be a laser stop used in the manufacture of the PCB 100 (as will be described in greater detail below). In some embodiments, the laser stop 130 is solely for manufacturing purposes. As such, the laser stop 130 may not be coupled to the circuitry of the PCB. However, in some embodiments, the laser stop 130 may be coupled to circuitry (e.g., laser stop 130 may be at ground potential).

In an embodiment, PCB 100 may also be characterized by a second chamfered edge 117 that couples the top surface 112 of the component region 110 to the bottom surface 108. In an embodiment, an angle $\theta_1$ of chamfered edge 115 may be substantially equal to $\theta_2$ of chamfered edge 117. The similarity of the angles $\theta_1$ and $\theta_2$ may be the result of the processing used to fabricate the PCB 100, as will be described in greater detail below. In an embodiment, angles $\theta_1$ and $\theta_2$ may not be the same.

Referring now to FIGS. 2A-2D a plan view illustration and a series of cross-sectional illustrations show a process for forming a pair of reciprocal PCBs from a single PCB stack. Fabricating pairs of reciprocal PCBs in accordance with such embodiments increases the utilization of the PCB stack and results in a reduction in waste.

Referring now to FIG. 2A, a plan view illustration of a PCB stack 250 is shown, in accordance with an embodiment. In an embodiment, the PCB stack 250 may comprise a first connector region $220_A$ with contacts $225_A$ on one end and a second connector region $220_B$ with contacts $225_B$ on the opposite end. As shown in FIG. 2A, a first buried (as indicated by dashed lines) laser stop $230_A$ may be formed proximate to the first connector region $220_A$, and a second buried (as indicated by dashed lines) laser stop $230_B$ may be formed proximate to the second connector region $220_B$. In an embodiment, the laser stops $230_A$ and $230_B$ may extend along the width of the PCB stack 250.

Referring now to FIG. 2B, a cross-sectional illustration of the PCB stack 250 of FIG. 2A is shown, in accordance with an embodiment. In an embodiment, the PCB stack 250 may comprise a plurality of alternating conductive and insulating layers (e.g., copper layers, pre-preg layers, core layers, etc.) The individual layers are omitted for clarity. However, a release layer embedded in the PCB stack 250 is shown. In an embodiment, the release layer may comprise the first laser stop $230_A$, the second laser stop $230_B$, and a release material 255. The release layer may be referred to a single layer. However, it is to be appreciated that the first laser stop $230_A$ may be formed over the release material 255 and the second laser stop $230_B$ may be formed below the release material 255. That is, the first laser stop $230_A$ and the second laser stop $230_B$ may be formed in different layers of the PCB stack 250. In other embodiments, the first laser stop $230_A$, the second laser stop $230_B$, and the release material 255 may all be formed in the same layer. In the illustrated embodiment, the release layer is shown as being substantially in the middle layer of the PCB stack 250. However, embodiments are not limited to forming the release layer as the middle layer, as will be described in greater detail below.

In an embodiment, the first component region $210_A$ may be formed above the release material 255. That is, surface $212_A$ of the first component region $210_A$ may be directly in contact with a top surface of the release material 255, and the bottom surface $208_A$ of the first component region $210_A$ may be the uppermost layer of the PCB stack 250. In an embodiment, the second component region $210_B$ may be formed below the release material 255. That is, surface $212_B$ of the second component region $210_B$ may be directly in contact with a bottom surface of the release material 255, and the bottom surface $208_B$ of the second component region $210_B$ may be the bottommost layer of the PCB stack 250. As shown, in FIG. 2B, the top layer $222_A$ of the first connector region $220_A$ may be the same surface as the bottom layer $208_B$ of the second component region $210_B$, and the top layer $222_B$ of the second connector region $220_B$ may be the same surface as the bottom layer $208_A$ of the first component region $210_A$.

Referring now to FIG. 2C, a cross-sectional illustration after a laser drilling operation is shown, in accordance with an embodiment. In an embodiment, openings $257_A$ and $257_B$ may be formed with a laser drilling process. The laser drilling process may include a first laser drilling from the top surface of the PCB stack 250 to the second laser stop $230_B$, and a second laser drilling from the bottom surface of the PCB stack 250 to the first laser stop $230_A$.

Due to the use of a laser drilling process, the sidewalls of the openings 257 will exhibit a chamfered or otherwise tapered profile. For example, the formation of opening $257_B$ results in chamfered edge $215_B$ between surface $212_B$ and surface $222_B$, and a corresponding chamfered edge $217_A$ between surface $208_A$ and surface $212_A$. Similarly chamfered edges $215_A$ and $217_B$ are formed by the laser drilling to form openings $257_A$. Accordingly, edges $215_A/217_A$ and $215_B/217_B$ may be mirror images of each other (with respect to angle of the chamfer, as described above) since both may be formed with substantially the same laser drilling process.

Referring now to FIG. 2D, a cross-sectional illustration after the release material 255 is removed and reciprocal PCBs $200_A$ and $200_B$ are separated from the PCB stack 250 is shown, in accordance with an embodiment. When the release layer is formed as the center layer of the PCB stack 250, the resulting PCBs $200_A$ and $200_B$ may be substantially similar to each other. That is, the first and second connector regions $220_A$ and $220_B$ may have the same first thickness $T_1$, and the first and second component regions $210_A$ and $210_B$ may have the same second thickness $T_2$.

Figure 3A:
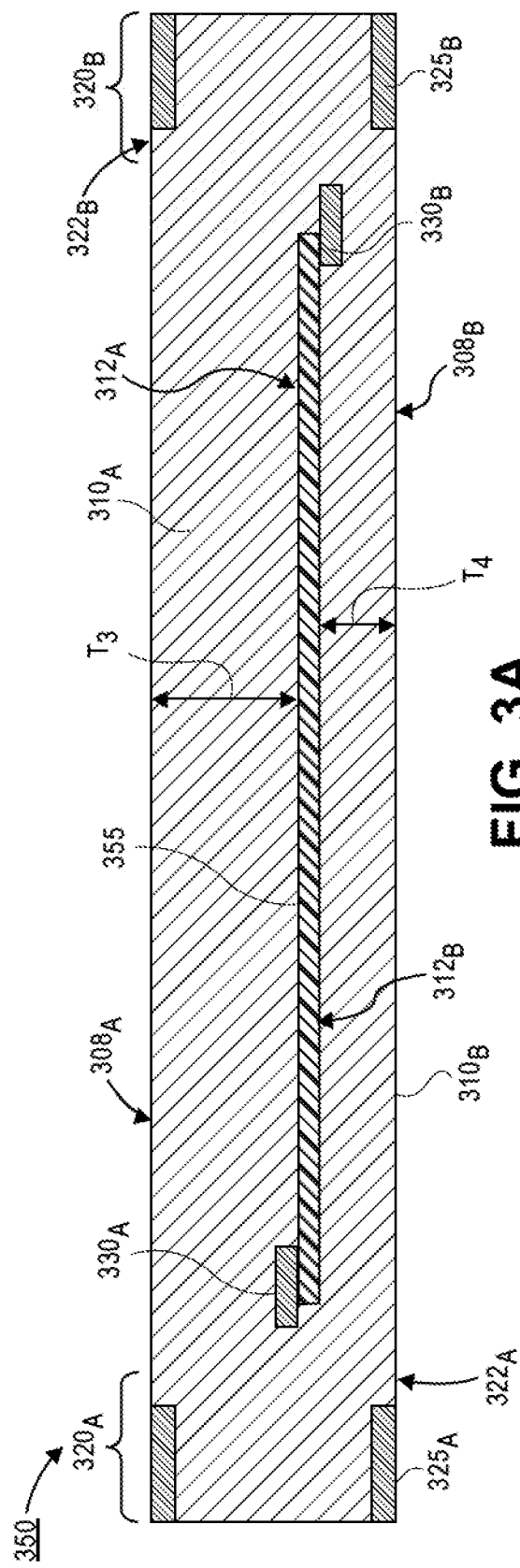
FIG. 3A is a cross-sectional illustration of a PCB stack with embedded laser stops and a release layer, where the release layer is not in the center layer of the PCB stack, in accordance with an embodiment.
Figure 3B:
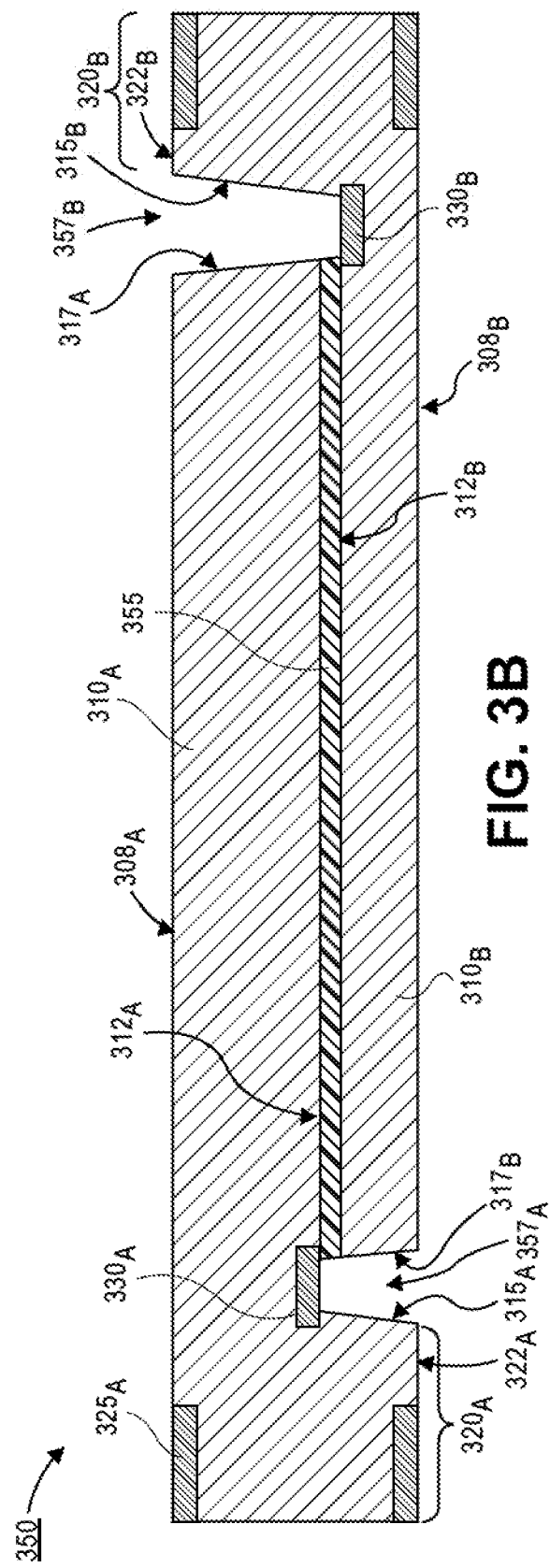
FIG. 3B is a cross-sectional illustration after openings are formed to expose the laser stops, in accordance with an embodiment.
Figure 3C:
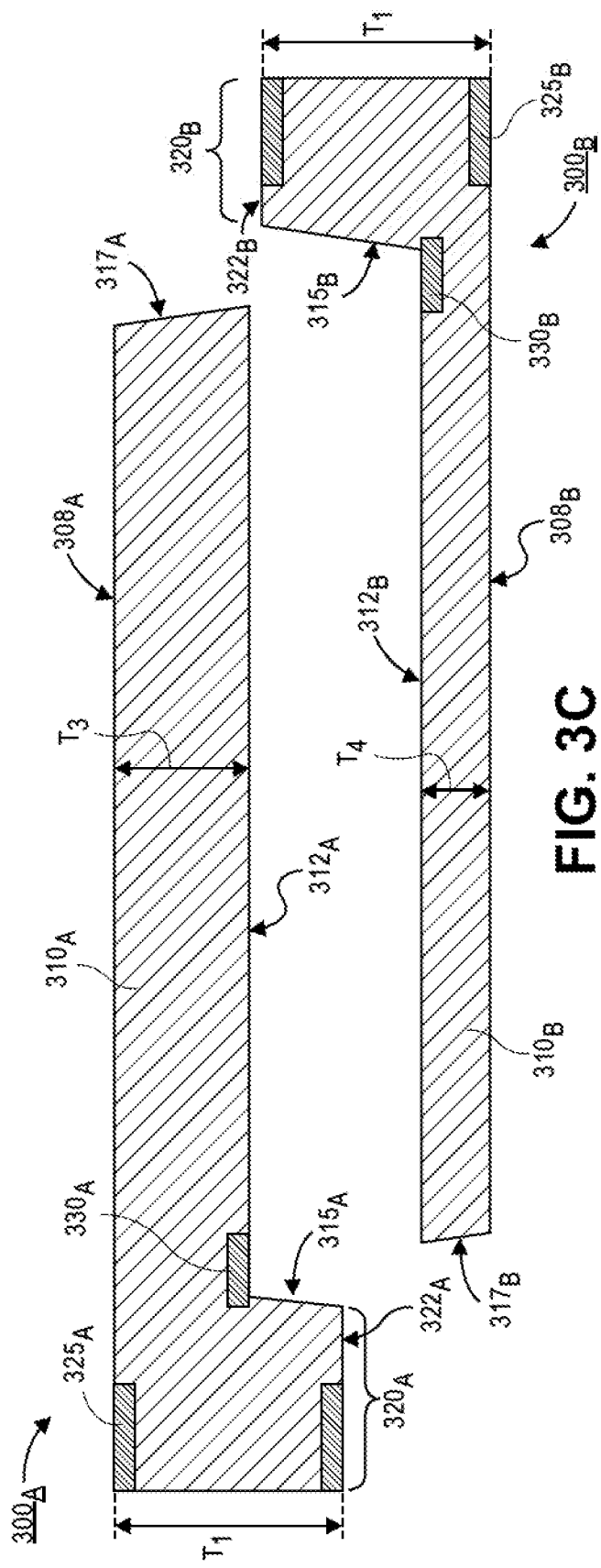
FIG. 3C is a cross-sectional illustration after the release layer is removed and the PCB stack is separated to provide a first PCB and a second PCB, where a component region of the first PCB has a different thickness than a component region of the second PCB, in accordance with an embodiment.

Referring now to FIGS. 3A-3C, a series of cross-sectional illustrations show a process for forming reciprocal PCBs from a PCB stack that do not have the same dimensions.

Referring now to FIG. 3A, a cross-sectional illustration of a PCB stack 350 is shown, in accordance with an embodiment. In an embodiment, PCB stack 350 may be substantially similar to PCB stack 250 described above, with the exception that the release layer is not the middle layer of the PCB stack 350. For example, the release material 355 may be positioned so that a thickness $T_3$ between surface $308_A$ and $312_A$ is greater than a thickness $T_4$ between surface $308_B$ and $312_B$. In an embodiment, the first component region $310_A$ and the first laser stop $330_A$ may be above the release material 355 and the second component region $310_B$ and the second laser stop $330_B$ may be below the release material 355. In the illustrated embodiment, the first connector region $320_A$ with contacts $325_A$ is on the left side and the second connector region $320_B$ with contacts $325_B$ is on the right side.

Referring now to FIG. 3B, a cross-sectional illustration of the PCB stack after openings $357_A$ and $357_B$ are formed to expose the first laser stop $330_A$ and the second laser stop $330_B$ is shown, in accordance with an embodiment. In an embodiment, opening $357_B$ may result in a tapered edge $315_B$ that couples surface $312_B$ to surface $322_B$ and a tapered edge $317_A$ that couples surface $308_A$ to surface $312_A$. Similarly, opening $357_A$ may result in a tapered edge $315_A$ that couples surface $312_A$ to surface $322_A$ and a tapered edge $317_B$ that couples surface $308_B$ to surface $312_B$.

Referring now to FIG. 3C, a cross-sectional illustration after the release material 355 is removed and reciprocal PCBs $300_A$ and $300_B$ are separated from the PCB stack 350 is shown, in accordance with an embodiment. When the release layer is formed in a location other than the center layer of the PCB stack 350, the resulting PCBs $300_A$ and $300_B$ may have different geometries. That is, the first and second connector regions $320_A$ and $320_B$ may have the same first thickness $T_1$, and the first and second component regions $310_A$ and $310_B$ may have the different thickness $T_3$ and $T_4$. For example, the thickness $T_3$ of the first component region $310_A$ may be greater than the thickness $T_4$ of the second component region $310_B$.

In FIGS. 2A-3C the laser stops 230/330 are described as being a single line that extends the width of the PCB stack. However, it is to be appreciated that the laser stop may also be formed in other configurations.

Figure 4:
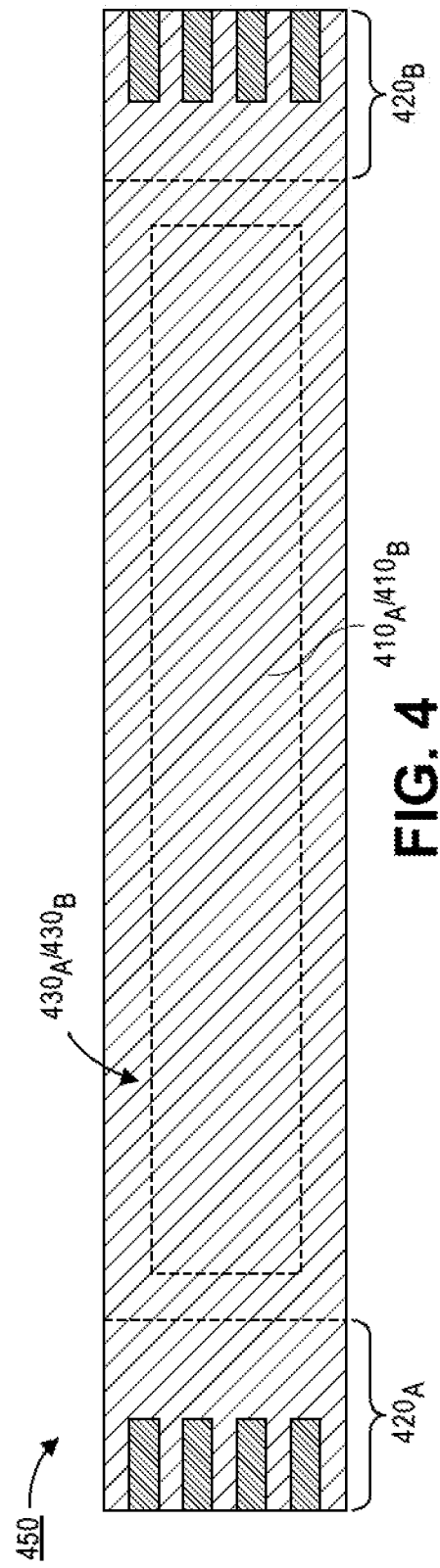
FIG. 4 is a plan view illustration of a PCB stack with ring shaped laser stops, in accordance with an embodiment.

Referring now to FIG. 4, a plan view illustration of a PCB stack 450 is shown in accordance with an embodiment. In an embodiment, a first connector region $420_A$ is formed on the left side of the PCB stack 450 and a second connector region $420_B$ is formed on the right side of the PCB stack 450. In an embodiment, the laser stops (shown with dashed lines) may form a ring around the first and second component regions $410_A/410_B$. It is to be appreciated that while a single ring is shown, that a first ring (i.e., laser stop $430_A$) may be formed above the release material (not shown), and a second ring (i.e., laser stop $430_B$) may be formed below the release material (not shown). In such a configuration, the laser drilling may release the first PCB from the second PCB and also singulate neighboring PCBs (not shown) (e.g., in a panel of a plurality of reciprocal PCB pairs).

Figure 5:
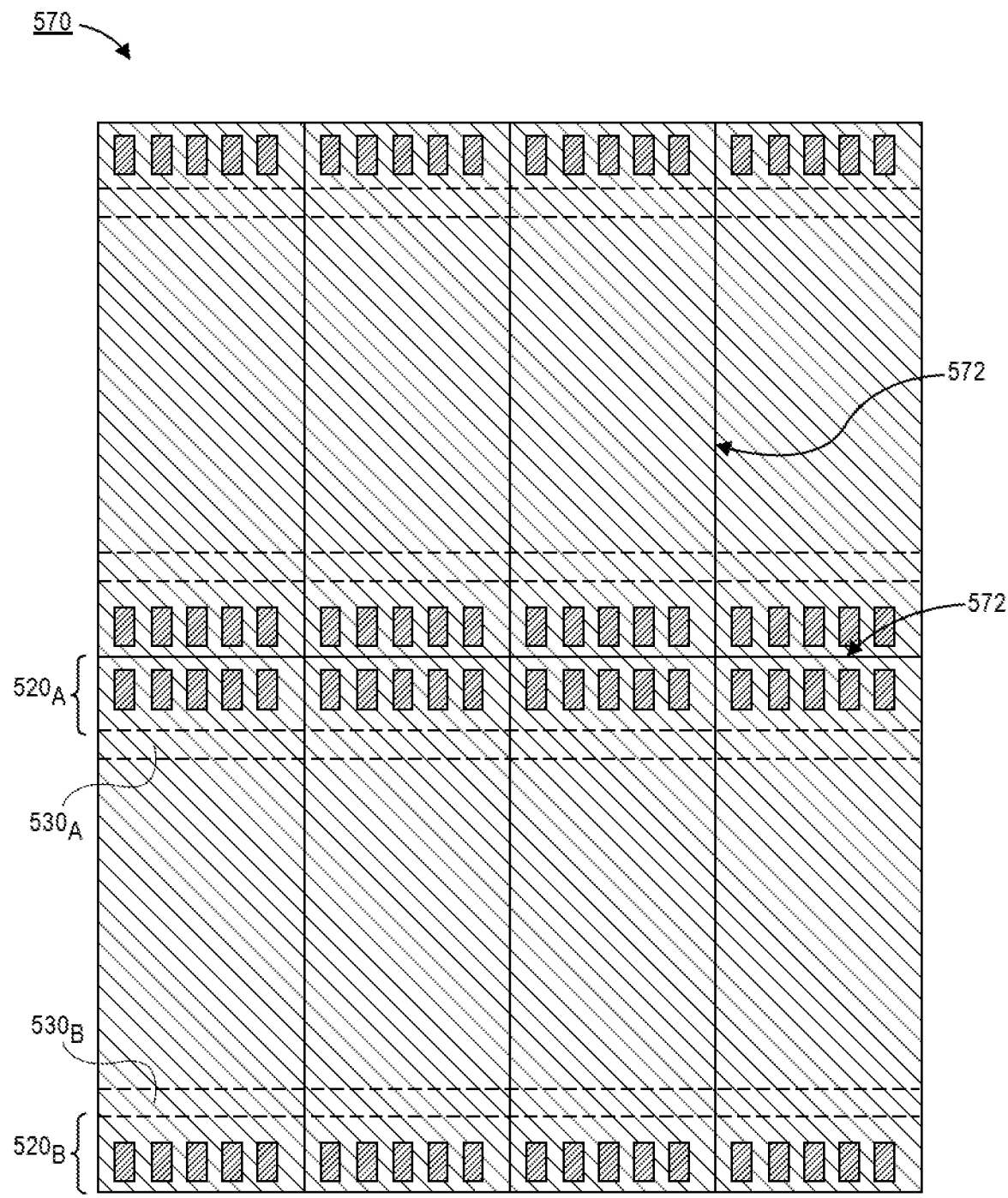
FIG. 5 is a plan view illustration of a panel from which a plurality of reciprocal pairs of PCBs with non-uniform thickness may be obtained, in accordance with an embodiment.

Referring now to FIG. 5, a panel 570 that comprises a plurality of reciprocal pairs of PCBs is shown, in accordance with an embodiment. In an embodiment, each reciprocal pair may comprise a first connector region $520_A$ and a second connector region $520_B$. As shown, the embedded laser stops $530_A$ and $530_B$ may be continuous across many reciprocal pairs. As such, the laser may continue in a direct path to singulate a plurality of PCBs in a single pass. In an embodiment, further singulation (e.g., with a saw or laser) may be implemented along saw streets 572 indicated with solid lines.

Figure 6:
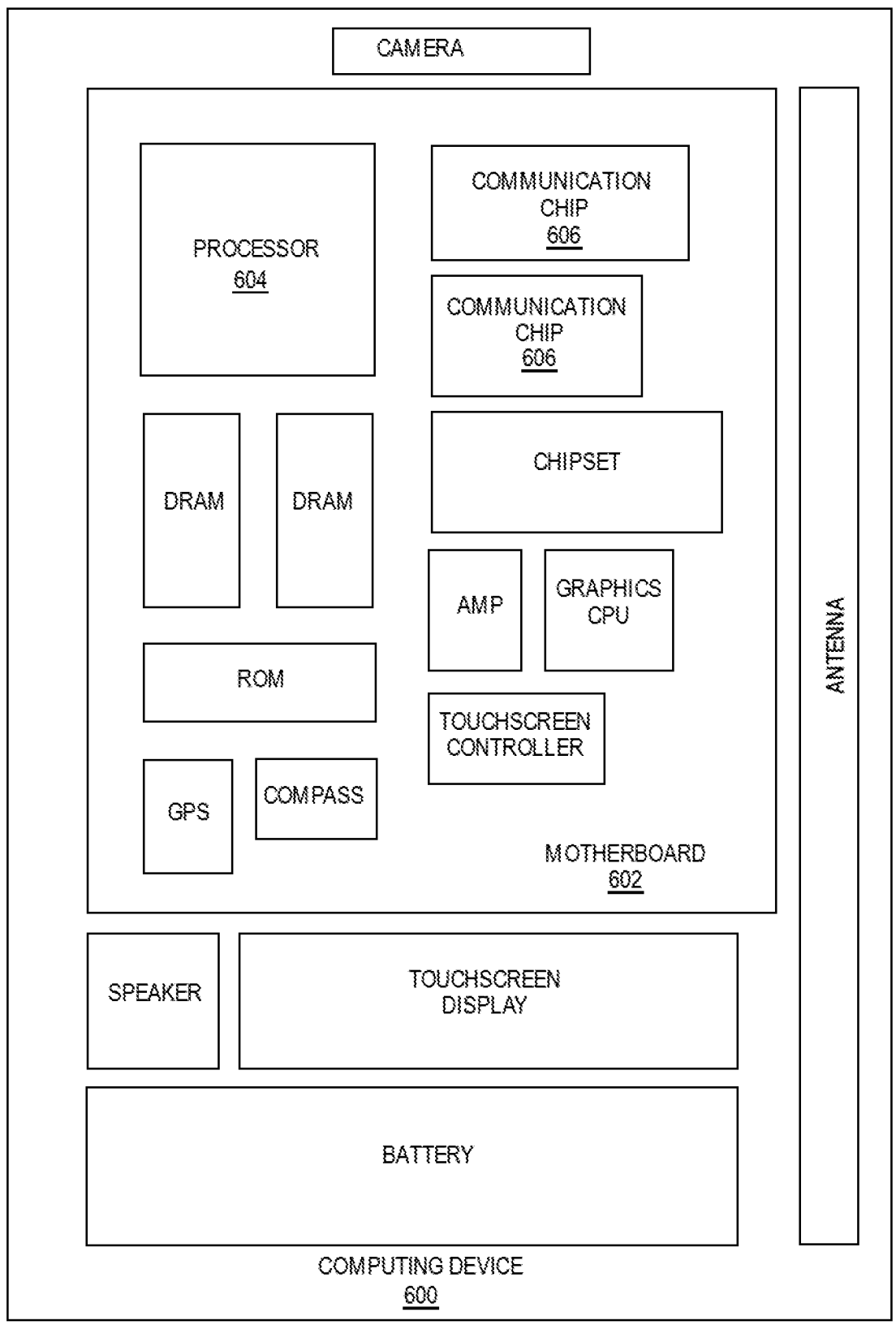
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be packaged on a PCB with a non-uniform thickness, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be packaged on a PCB with a non-uniform thickness, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a printed circuit board (PCB), comprising: a connector region with a top surface and a bottom surface; and a component region with a top surface and a bottom surface, wherein the bottom surface of the connector region is coplanar with the bottom surface of the component region, and wherein the top surface of the connector region is not coplanar with the top surface of the component region.

Example 2: the PCB of Example 1, wherein the component region has a first thickness and the connector region has a second thickness that is greater than the first thickness.

Example 3: the PCB of Example 1 or Example 2, wherein the top surface of the component region is coupled to the top surface of the connector region by a chamfered sidewall.

Example 4: the PCB of Examples 1-3, wherein an end of the component region opposite from the connector region has a chamfered surface between the top surface and the bottom surface of the component region.

Example 5: the PCB of Examples 1-4, further comprising a laser stop at the interface between the chamfered sidewall and the top surface of the component region.

Example 6: the PCB of Examples 1-5, wherein a top surface of the laser stop is substantially coplanar with a top surface of the component region.

Example 7: the PCB of Examples 1-6, wherein a width of the laser stop extends substantially along a width of the PCB.

Example 8: the PCB of Examples 1-7, wherein the laser stop is electrically isolated from circuitry of the PCB.

Example 9: the PCB of Examples 1-8, wherein the laser stop is a ring around the component region.

Example 10: the PCB of Examples 1-9, wherein the second thickness is at least twice as large as the first thickness.

Example 11: the PCB of Examples 1-10, wherein the second thickness is 800 microns.

Example 12: the PCB of Examples 1-11, wherein the connector region is an M.2 connector.

Example 13: a method of fabricating a printed circuit board (PCB), comprising: forming a PCB stack with a first connector region on a first end of the PCB stack and a second connector region on a second end of the PCB stack, and wherein the PCB stack further comprises a release layer separating a first component region of the PCB stack from a second component region of the PCB stack, the release layer comprising, a first laser stop, a release material, and a second laser stop; laser drilling through the PCB stack to expose the first laser stop, wherein the laser drilling separates the first connector region from the second component region; laser drilling through the PCB stack to expose the second laser stop, wherein the laser drilling separates the second connector region from the first component region; and separating the first component region from the second component region and removing the release material.

Example 14: the method of Example 13, wherein the first connector and the second connector have a first thickness, and wherein the first component region and the second component region have a second thickness that is less than the first thickness.

Example 15: the method of Example 13 or Example 14, wherein the first thickness is 800 microns.

Example 16: the method of Examples 13, wherein the first connector and the second connector are M.2 connectors.

Example 17: the method of Examples 13-16, wherein the laser drilling produces chamfered edges on the first connector and the second connector.

Example 18: the method of Examples 13-17, wherein the first laser stop remains on the first component region, and wherein the second laser stop remains on the second component region.

Example 19: the method of Examples 13-18, wherein the first laser stop is above the release material and the second laser stop is below the release material.

Example 20: the method of Examples 13-19, wherein the first connector and the second connector have a first thickness, the first component region has a second thickness, and the second component region has a third thickness, wherein the second thickness is not equal to the third thickness, and wherein the first thickness is greater than the second thickness and the third thickness.

Example 21: an electronics package, comprising: a printed circuit board (PCB), wherein the PCB comprises a connector region and a component region, wherein the connector region has a first thickness and the component region has a second thickness that is less than the first thickness; and a plurality of components electrically and mechanically coupled to the component region of the PCB.

Example 22: the electronics package of Example 21, wherein the connector region is an M.2 connector.

Example 23: the electronics package of Example 21 or Example 22, wherein a total thickness of the electronics package is less than 1.5 mm.

Example 24: the electronics package of Examples 21-23, wherein a bottom surface of the component region is substantially coplanar with a bottom surface of the connector region, and wherein a top surface of the connector region is coupled to a top surface of the component region by a chamfered surface.

Example 25: the electronics package of Examples 21-24, wherein the chamfered surface ends at a laser stop on the component region of the PCB.

What is claimed is:

1. A printed circuit board (PCB), comprising:
   a connector region with a top surface and a bottom surface, the top surface including a conductive pad; and
   a component region with a top surface and a bottom surface, the top surface of the component region to receive a component, wherein the bottom surface of the connector region is coplanar with the bottom surface of the component region, wherein the top surface of the connector region is not coplanar with the top surface of the component region, wherein the top surface of the component region is coupled to the top surface of the connector region by a chamfered sidewall that extends from the top surface of the component region to the top surface of the connector region, and wherein the component region has a vertical thickness less than a vertical thickness of the connector region.

2. The PCB of claim 1, wherein an end of the component region opposite from the connector region has a chamfered surface between the top surface and the bottom surface of the component region.

3. The PCB of claim 1, further comprising a laser stop at the interface between the chamfered sidewall and the top surface of the component region.

4. The PCB of claim 3, wherein a top surface of the laser stop is substantially coplanar with a top surface of the component region.

5. The PCB of claim 3, wherein a width of the laser stop extends substantially along a width of the PCB.

6. The PCB of claim 3, wherein the laser stop is electrically isolated from circuitry of the PCB.

7. The PCB of claim 3, wherein the laser stop is a ring around the component region.

8. The PCB of claim 1, wherein the vertical thickness of the connector region is at least twice as large as the vertical thickness of the component region.

9. The PCB of claim 8, wherein the second thickness is 800 microns.

10. The PCB of claim 1, wherein the connector region is an M.2 connector.

* * * * *